(12) United States Patent
Herr et al.

(10) Patent No.: US 8,194,379 B2
(45) Date of Patent: Jun. 5, 2012

(54) INRUSH CURRENT CONTROL SYSTEM WITH SOFT START CIRCUIT AND METHOD

(75) Inventors: James Herr, San Jose, CA (US);
Zhizhong Hou, Fremont, CA (US);
Christopher Bruce Umminger, Mountain View, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 12/723,841

(22) Filed: Mar. 15, 2010

(65) Prior Publication Data
US 2010/0225294 A1  Sep. 9, 2010

Related U.S. Application Data

(63) Continuation of application No. 11/153,680, filed on Jun. 16, 2005, which is a continuation-in-part of application No. 11/102,863, filed on Apr. 11, 2005, now abandoned.

(51) Int. Cl.
*H02H 9/08* (2006.01)

(52) U.S. Cl. ...................................... 361/93.9

(58) Field of Classification Search .................. 361/93.9
See application file for complete search history.

(56) References Cited

U.S. PATENT DOCUMENTS

| | | | |
|---|---|---|---|
| 4,540,893 A | 9/1985 | Bloomer | |
| 5,194,760 A | 3/1993 | Braun et al. | |
| 5,374,887 A | 12/1994 | Drobnik | |
| 5,390,070 A | 2/1995 | Niedermeier | |
| 5,740,106 A | 4/1998 | Nazarian | |
| 5,747,975 A * | 5/1998 | Colandrea et al. | 323/276 |
| 5,847,554 A | 12/1998 | Wilcox et al. | |
| 6,021,036 A | 2/2000 | Bijlenga et al. | |
| 6,104,584 A | 8/2000 | Liu | |
| 6,583,974 B1 | 6/2003 | Juntunen et al. | |
| 2003/0218388 A1 | 11/2003 | Lohmueller et al. | |
| 2003/0223172 A1 | 12/2003 | Priest | |
| 2005/0253627 A1 | 11/2005 | Claseman | |
| 2005/0269631 A1 | 12/2005 | Ryoo et al. | |
| 2006/0082939 A1 | 4/2006 | Summer | |

FOREIGN PATENT DOCUMENTS

| | | |
|---|---|---|
| EP | 0 674 389 A1 | 9/1995 |
| JP | 05-102822 A | 4/1993 |
| JP | 07-175533 A | 7/1995 |
| JP | 08-051349 A | 2/1996 |
| JP | 2003339152 A * | 11/2003 |

OTHER PUBLICATIONS

European Search Report issued in European Patent Application No. 06 760 623.6-2215, mailed Apr. 27, 2010.

* cited by examiner

*Primary Examiner* — Rexford N Barnie
*Assistant Examiner* — Ann Hoang
(74) *Attorney, Agent, or Firm* — McDermott Will & Emery LLP

(57) ABSTRACT

A method of and system for controlling the inrush current generated in a MOSFET of an inrush current control system, wherein the MOSFET includes a source, gate and drain. The dV/dt at the drain of the MOSFET is controlled so as to set the inrush current level as a function of dV/dt, independent of current limit without requiring a separate capacitor connected between the gate and drain of the MOSFET so that the MOSFET can turn on and off more quickly.

14 Claims, 6 Drawing Sheets

INRUSH CURRENT CONTROL SYSTEM WITH SOFT START CIRCUIT AND METHOD

RELATED APPLICATIONS

This application is a Continuation of U.S. patent application Ser. No. 11/153,680, filed on Jun. 16, 2005, which is a Continuation-in-part of U.S. patent application Ser. No. 11/102,863, filed on Apr. 11, 2005, which is now abandoned, the entire contents of each of which are hereby incorporated by reference.

FIELD OF THE DISCLOSURE

The present disclosure generally relates to circuits for limiting inrush current, and more particularly to an inrush current control system with a soft start circuit, and methods of controlling the inrush current of a control system as a function of the ramp rate of a soft start voltage.

BACKGROUND OF THE DISCLOSURE

When circuit boards are inserted into live backplanes (typically at −48V), the input of a board's power module or switching power supply (or bypass capacitors if provided) can draw huge transient currents as they charge up. The transient currents can cause permanent damage to the board's components and glitches on the system power supply. By limiting inrush current caused by transient effects one protects the board from excessive current spikes. Three commercially available circuits for limiting inrush current are shown in FIGS. 1-3.

In FIG. 1, the circuit shown is commercially available from the current assignee as the Hot Swap Controller LT4250, Hot Swap being a trademark of the present assignee. The controller includes an active current limit inverting amplifier ACL that is connected to external circuitry so as to limit the inrush currents to an adjustable value by controlling the gate voltage of an external N-channel pass transistor FET. The pass transistor FET is turned off if the input voltage is less than a programmable under voltage threshold or greater than an over voltage threshold. An adjustable current limit also protects the system against shorts. After a 500 microsecond timeout the current limit circuit activates an electronic circuit breaker. By placing an external capacitor $C_R$ between the drain and the gate of the FET and using a current limited pull up in the ACL amplifier (represented by the $I_{GATE}$ current source), the inrush current can be set by the ratio between the load capacitance $C_L$ and $C_R$, which is independent of the circuit breaker threshold. By setting the inrush current well below the current limit of the circuit breaker threshold, the circuit breaker can be optimized to protect the FET. A small circuit breaker time $t_{CB}$ reduces the power consumed by the FET upon a short-circuit event keeping it within its safe operating area. However, this technique typically requires a capacitor $C_G$ between the gate and source of the FET that is much larger than $C_R$ to avoid turning on the FET at insertion of a board equipped with the controller into a live backplane. Specifically, the capacitor $C_G$ prevents the FET from momentarily turning on when the power pins first make contact with the live backplane. Without the capacitor $C_G$, capacitor $C_R$ would pull the gate of the FET up to a voltage roughly equal to $V_{EE}$ times $C_R/C_{GS}$ (the gate-source capacitance of the FET) before the circuit can power up and actively pull the gate of the FET low. By placing the capacitor $C_G$ in parallel with the gate capacitance of FET, the problem is solved. This large $C_G$ makes the turn-off of the FET difficult in a hard short event and increases the SOA requirement. The approach also complicates the selection of the compensation network used to stabilize the active current limit.

In a second controller shown in FIG. 2, commercially available from the present assignee as the LTC4252, output current is controlled by three stages of current limiting: a timed circuit breaker, active current limiting and a fast feed forward path that limits peak current under worst-case catastrophic fault conditions. Active current limit is used during the generation of inrush current in order to eliminate $C_R$ and reduce the value of $C_G$ (components used in the FIG. 1 controller). One drawback of this approach is the long circuit-breaker time $t_{CB}$ required to accommodate the current limit servo time to avoid timeout during startup and input step. When a short occurs, the FET experiences the full current limit through the long $t_{CB}$, which results in a large SOA requirement and makes the selection of the FET difficult in a high power application. Reducing the current limit as a function of $V_{OUT}$ (current limit foldback) reduces the SOA requirement during startup and the input step. It also performs satisfactorily during a hard short. However, in a soft short event, the FET may still experience the full scale current limit for $t_{CB}$, which in turn can result in a large stress on the FET.

A third circuit shown in FIG. 3, commercially available from Supertex of Sunnyvale Calif. as the HV301/311, also controls the output current with an active current limiting circuit. During the initial power application, the gate of the external pass device (NMOSFET) is clamped low to suppress contact bounce. Thereafter, under voltage/over voltage (UV/OV) supervisors and power-on-reset work together to suppress gate turn-on of the NMOSFET until mechanical bounce has ended. An active current limit control circuit is then activated during power-up to limit the inrush current. The capacitor $C_2$, connected between the RAMP pin and the drain of the NMOSFET, allows the inrush current to be lower than the current limit. However, the current limit circuit is still active and there is no way to distinguish between normal inrush current and a current overload. Similar to the LTC4252, a long circuit-breaker time $t_{CB}$ (100 ms typical) is required to avoid circuit-breaker timeout during startup. Thus, when an output short occurs, the NMOSFET will conduct at the current limit level for the whole $t_{CB}$, severely stressing the NMOSFET.

FIG. 4 illustrates a circuit, which is described in greater detail in U.S. Pat. No. 5,952,817, assigned to the present assignee. This circuit is a switching regulator that slows down both the voltage and current slew rates. However, the purpose of slowing down both the voltage and current slew rates is to reduce the high frequency noise introduced to the power supply and ground. A Miller capacitor $C_V$, 20, and the adjustable current $I_{VSLEW}$ set the voltage slew rate, dV/dt, at node 22. Amplifiers 24, 26 and 28 act to control the slew rate of the transistor Q1 current.

SUMMARY OF THE DISCLOSURE

In accordance with one aspect of the current disclosure, the method of a system for and method of controlling the inrush current generated in a MOSFET of an inrush current control is disclosed. The method and system control the dV/dt at the drain of the MOSFET so as to set the inrush current level as a function of dV/dt, independent of current limit without requiring a separate capacitor connected between the gate and drain of the MOSFET.

In accordance with another aspect of the present disclosure a system for and method of controlling the turn on output current of an inrush current control system is disclosed. The system and method are designed to control the dV/dt at the drain of a FET so as to set the inrush current through the FET as a function of dV/dt; and control the dI/dt of the turn on output current as a function of the ramp rate of a soft start voltage produced at an input of the control system when the control system is turned on.

In accordance with one disclosed embodiment a ramp voltage is generated at the drain of the MOSFET when the voltage on the gate of the MOSFET is sufficient for the MOSFET to turn on.

In accordance with one disclosed embodiment the inrush current control system includes a component coupled to the drain of the MOSFET, such that a ramp voltage is generated at the drain of the MOSFET and the inrush current is limited. The component can include a capacitive or/and a resistive element coupled to the drain of the MOSFET.

In accordance with one disclosed embodiment wherein the current is limited through the MOSFET during an over current condition, and/or during an output short event.

In accordance with one disclosed embodiment the rate of rise of the inrush current, dI/dt is also controlled.

In accordance with one disclosed embodiment over current protection is provided without affecting the inrush current.

In accordance with one disclosed embodiment the inrush current control system includes a current input, and a ramp pin output, the ramp pin output being coupled to the drain of the MOSFET, and the voltage at the ramp pin is held during power up or power step conditions.

In accordance with another aspect of the present disclosure a system for and method of controlling the turn on output current of an inrush current control system is disclosed. The system and method are designed to control the dV/dt at the drain of a FET so as to set the inrush current level through the FET as a function of dV/dt; and control the dI/dt of the inrush current as a function of the ramp rate of a soft start voltage produced at an input of the control system when the control system is turned on.

In accordance with one disclosed embodiment the soft start voltage is clamped to a predetermined value.

In accordance with one disclosed embodiment the soft start voltage limit is established by a clamping circuit.

In accordance with one disclosed embodiment the inrush current control system includes a capacitor coupled to the drain, and a ramp current is generated through the capacitor to the drain of the FET as a function of the soft start voltage. In accordance with one disclosed embodiment, the capacitor is configured so that the FET can turn off independently of the value of the capacitor.

BRIEF DESCRIPTION OF THE DRAWINGS

Reference is made to the attached drawings, wherein elements having the same reference character designations represent like elements throughout, and wherein.

DETAILED DESCRIPTION OF THE DRAWINGS

Figure 5:
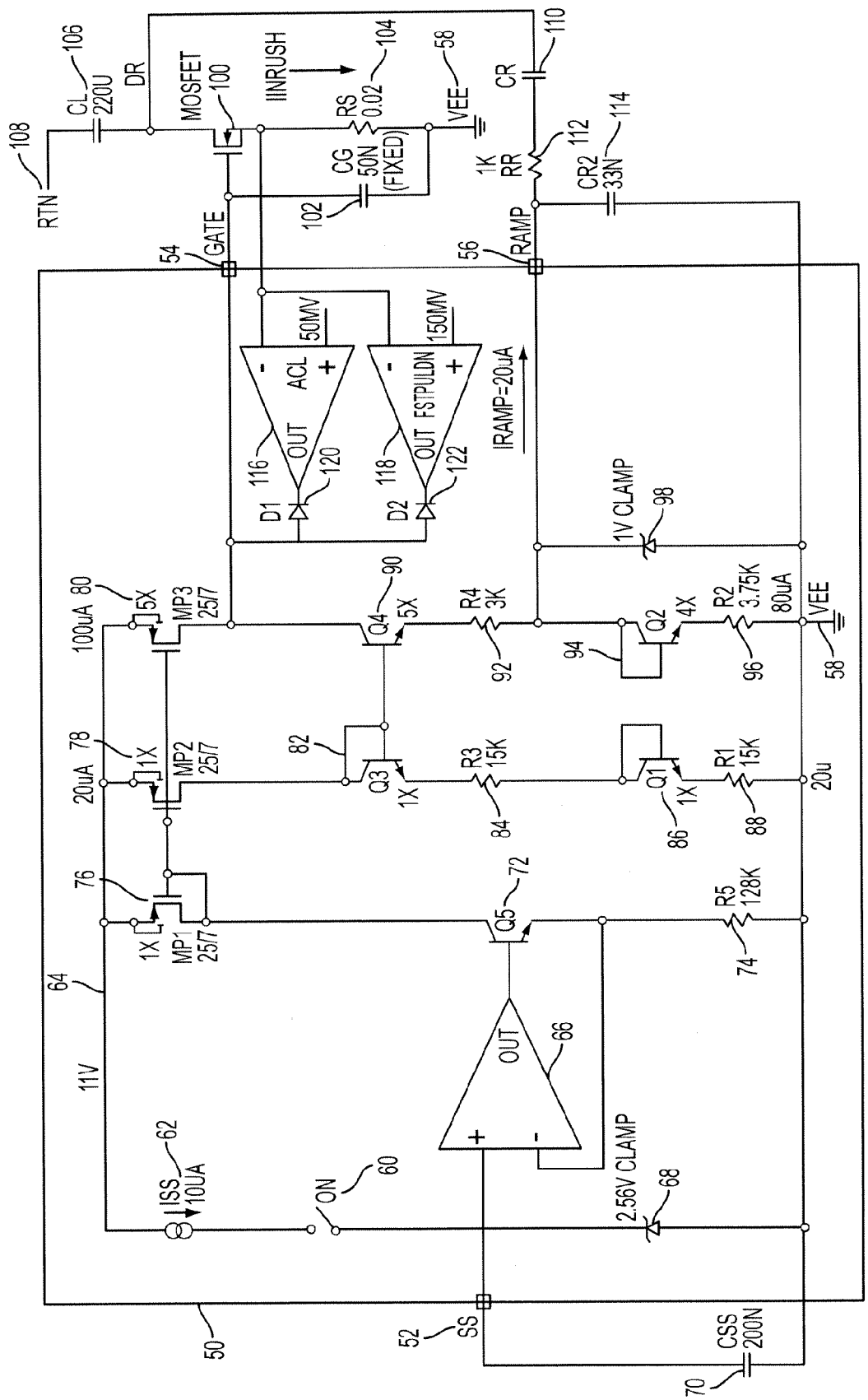
FIG. 5 is a partial schematic and partial block diagram of an embodiment of a inrush current control system designed in accordance with at least one aspect of the invention.

A preferred embodiment of the inrush current control system is shown in FIG. 5. The system preferably is in the form of an integrated circuit 50 having a soft start terminal pin (SS) 52 an output terminal pin (GATE) 54, an output terminal pin (RAMP) 56, and a system ground terminal ($V_{EE}$) 58. The system includes a switch 60, which closes when the device is connected to a power supply (not shown). One contact of the switch is connected to a current source $I_{SS}$ 62, which in turn is connected to a positive voltage rail 64. The other contact of the switch 60 is connected to the non-inverting input of an amplifier 66. The non-inverting input of the amplifier 66 is also connected to the cathode of the clamping circuit 68, illustrated as a Zener diode, and the soft start junction (SS) 52. The anode of diode 68 is connected to system ground ($V_{EE}$) 58. Junction (SS) 52 is also connected to one plate of the external soft start capacitor ($C_{SS}$) 70. The other plate of the capacitor ($C_{SS}$) 70 is also connected to system ground ($V_{EE}$) 58.

The output of the amplifier 66 is connected to the base of the bipolar transistor ($Q_5$) 72. The emitter of transistor ($Q_5$) 72 is connected to the inverting input of the amplifier 66, and to the resistor ($R_5$) 74. The latter in turn is connected to system ground ($V_{EE}$) 58. The collector of the transistor ($Q_5$) 72 is connected to the drain of MOSFET ($MP_1$) 76, which forms a part of a current mirror, the latter preferably including MOSFETs ($MP_1$) 76, ($MP_2$) 78 and ($MP_3$) 80. Each of the MOSFETs ($MP_1$) 76, ($MP_2$) 78 and ($MP_3$) 80 has its source connected to the voltage rail 64, and its gates connected together. The gate of the MOSFET ($MP_1$) 76 is connected to its drain and the collector of the transistor ($Q_5$) 72. The MOSFET ($MP_2$) 78 has its drain connected to the collector and base of the bipolar transistor ($Q_3$) 82, which in turn has its emitter connected through the resistor ($R_3$) 84 to the collector and base of the bipolar transistor ($Q_1$) 86. The emitter of transistor ($Q_1$) 86 is connected through resistor ($R_1$) 88 to system ground ($V_{EE}$) 58.

The drain of the MOSFET ($MP_3$) 80 is connected to the (GATE) terminal 54 and to the collector of bipolar transistor ($Q_4$) 90. The latter has its collector tied to the base and collector of the transistor ($Q_3$) 82. The emitter of transistor ($Q_4$) 90 is connected through resistor ($R_4$) 92 to the (RAMP) terminal 56, and to the collector and base of the bipolar transistor ($Q_2$) 94. The emitter of transistor ($Q_2$) is connected to through the resistor ($R_2$) 96 to system ground ($V_{EE}$) 58. The (RAMP) terminal 56 is also connected to the cathode of the clamping circuit 98, which is illustrated as a Zener diode having its anode connected to system ground ($V_{EE}$) 58. The clamping circuit 98 holds the (RAMP) terminal close to the regulated 1V level during input voltage step.

The (GATE) terminal 54 is connected to the gate of the MOSFET 100 of an external circuit (external to the integrated circuit) and through capacitor ($C_G$) 102 to system ground ($V_{EE}$) 58. The source of MOSFET 100 is connected through resistor ($R_S$) 104 to system ground ($V_{EE}$) 58. The drain of the MOSFET 100 is connected through capacitor ($C_L$) 106 to a voltage source (RTN) 108, and to one plate of capacitor ($C_R$) 110. The other plate of the capacitor ($C_R$) 110 is connected through resistor (RR) 112 to the (RAMP) terminal 56. The (RAMP) terminal 56 is also connected through capacitor ($CR_2$) 114 to system ground ($V_{EE}$) 58.

In addition to the foregoing the preferred inrush current control system includes two over-current protection components besides the inrush control circuits, both preferably provided as a part of the integrated circuit 50. The two over-current protection components preferably includes an active current limit (ACL) amplifier 116 having its inverting input connected to sense voltage from the source of the MOSFET 100, its output connected to the cathode of diode 120 (which in turn has its anode connected to the gate terminal 54) and its non-inverting input connected to a 50 mV source so that the amplifier serves as a circuit breaker comparator with an input threshold of 50 mV. The other over-current protection component preferably includes a fast pull down (FSTPULDN) comparator 118 having its inverting input also connected to receive the sensed voltage from the source of the MOSFET 100, its output connected to the cathode of diode 122 (which in turn has its anode connected to the gate terminal 54) and its non-inverting input connected to an input threshold of 150 mV.

Figure 6:
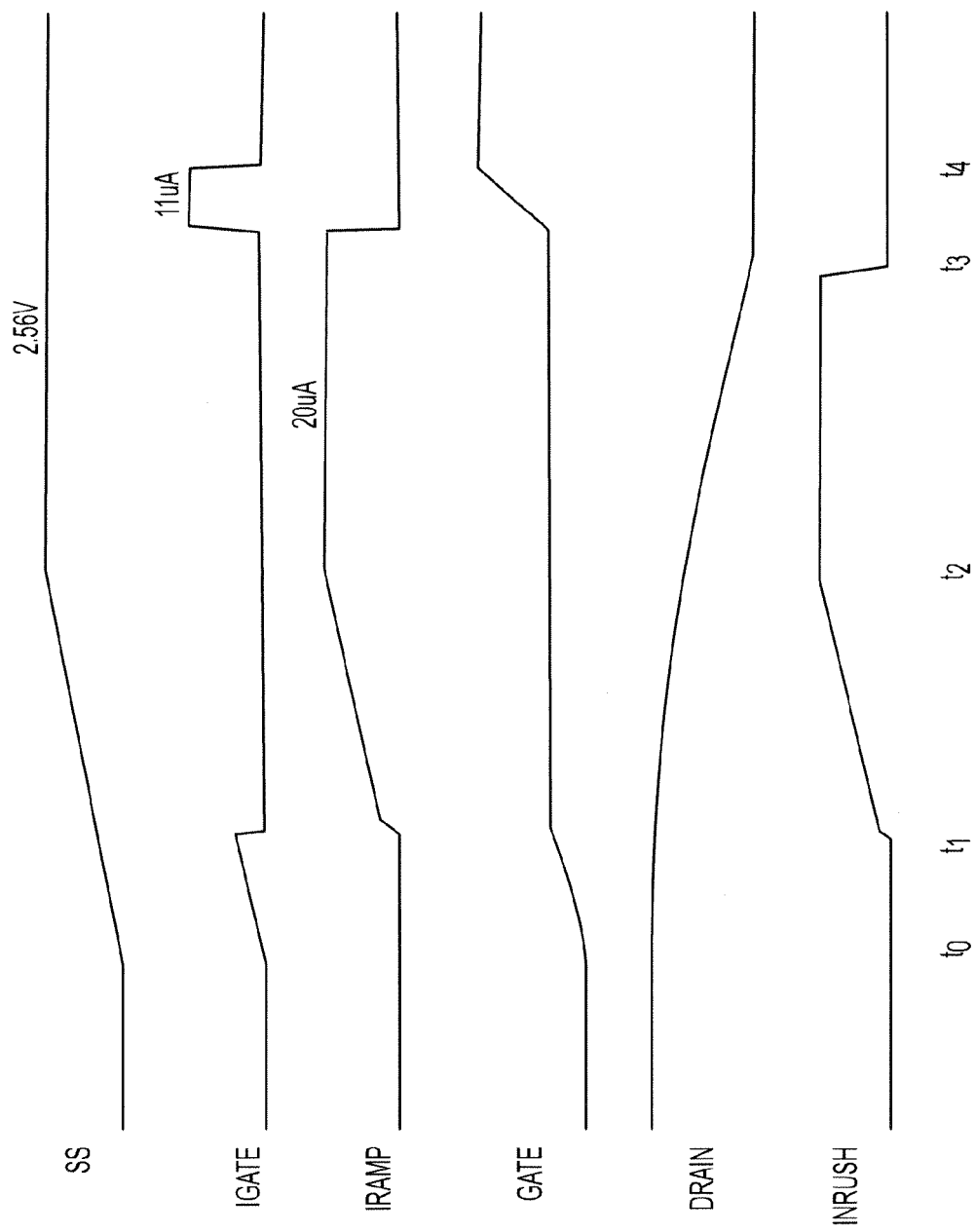
FIG. 6 is a timing diagram illustrating the inrush control behavior of the control system shown in FIG. 5.

In operation, FET 100 turn-on starts when the system is connected to a power supply and the switch (S) 62 is closed (at time $t_0$ as shown in FIG. 6). As the $I_{SS}$ current flows though the switch 62, it will start charging external soft-start capacitor $C_{SS}$ with a pull-up current from the $I_{SS}$ source. Current flow to the capacitor $C_{SS}$ will create a voltage drop across $C_{SS}$. This will also produce an output signal of the amplifier 66 at the emitter of transistor ($Q_5$) 72. This will result in pull-up current flowing through the transistor ($Q_5$) 72 and the resistor ($R_5$) 74. The voltage thereby generated across the resistor ($R_5$) 74 is the same voltage appearing across the capacitor ($C_{55}$) 70. The current flowing from MOSFET ($MP_1$) 76 is mirrored so as that a current flows from the MOSFETs ($MP_2$) 78 and ($MP_3$) 80. The current flowing the resistors ($R_1$)-($R_4$) 82, 86, 90 and 96, generate 300 mV of emitter degeneration through transistors ($Q_1$)-($Q_4$) 82, 86, 90 and 94 so as to help the circuit withstand residual noise at the (RAMP) terminal 54.

The voltage applied across the capacitor ($C_{SS}$) 70 will thus generate a GATE current at the terminal 54 for GATE pull-up. When the GATE voltage at (GATE) terminal 54 reaches the threshold voltage of the MOSFET 100 (at $t_1$ in FIG. 6), the $I_{INRUSH}$ current will start flowing through the MOSFET 100, which is set by a RAMP current ($I_{RAMP}$) that starts to flow through $C_R$. The RAMP current rises until it reaches a constant when the voltage across capacitor ($C_{SS}$) 70 reaches its clamped value (at $t_2$ in FIG. 6). In one example the component values are set so that the $V_{SS}$ across capacitor $C_{SS}$ is clamped to 2.56V (the bias voltage of the clamping circuit), corresponding to a constant GATE current of 11 μA and a constant $I_{RAMP}$ of 20 μA as illustrated in FIG. 6. The RAMP pin voltage at the RAMP terminal 56 is regulated at 1V, and the ramp rate at the DRAIN terminal 54 sets the current $I_{INRUSH}$ of the FET 100 through the resistor 104 as follows:

$$I_{INRUSH} = I_{RAMP} \cdot C_L / C_R \quad (1)$$

The capacitor $CR_2$ and the resistor RR are used to filter the noise at the RAMP terminal 56 and each are optional.

When the DRAIN is ramped down to $V_{EE}$, $I_{RAMP}$ drops to 0 (at $t_3$ in FIG. 6) and $I_{GATE}$ pulls the GATE up to the supply of the ramp control circuit (at $t_4$ in FIG. 6).

FIG. 6 illustrates the operation of the system and shows that the ramp rate of the voltage across capacitor $C_{SS}$ 70 determines the dI/dt of $I_{INRUSH}$. Specifically, $$dV_{SS}/dt = I_{SS}/C_{SS}; \quad (2)$$

$$dV_{SS}/dt \cdot 1/R_S = dI_{RAMP}/dt = I_{SS}/(C_{SS} \cdot R_S); \quad (3)$$

and $$dI_{INRUSH}/dt = (dI_{RAMP}/dt) \cdot (C_L/C_R) = (I_{SS} \cdot C_L) / (C_{SS} \cdot R_S \cdot C_R) \quad (4)$$

The exemplary embodiment thus sets the $I_{INRUSH}$ current by a capacitor $C_R$ between the DRAIN and a dedicated RAMP terminal that is regulated separately from the GATE of the FET 100. The advantages of this approach include (1) it does not require a large $C_G$ that relates to $C_R$ so the turn-off of the FET 100 can be fast even for large load applications; and (2) it incorporates a soft start technique that controls the dI/dt of the $I_{INRUSH}$ current. Other advantages will be will be evident to those skilled in the art.

Used in conjunction with the over-current protection components (ACL amplifier 116 and FSTPULDN comparator 118) as shown in FIG. 5, the inrush current control technique presented in this disclosure provides a general method that reduces the SOA requirement of the MOSFET. In an over-current condition, when the voltage drop across $R_S$ 104 exceeds 50 mV, the ACL amplifier 116 is activated and a short circuit breaker timer (520 μs typical) is started. The ACL amplifier 116 servos the GATE of the MOSFET 100 to maintain a constant output current of 50 mV/$R_S$. When the circuit breaker timer expires, the MOSFET 100 is turned off. In a low-impedance output short event, when the voltage drop across $R_S$ exceeds 150 mV, the FSTPULDN comparator 118 immediately pulls down the gate of MOSFET 100. Once the voltage drop across $R_S$ 104 falls below 150 mV, but is still above 50 mV, the ACL amplifier 116 servos the GATE of MOSFET 100 until the circuit breaker timer expires. Because the inrush control is independent of the current limit or circuit breaker functions, the circuit breaker timer can be very short so as to substantially reduce the stress on the FET 100 in an over-current condition such as an output short.

Figure 1:
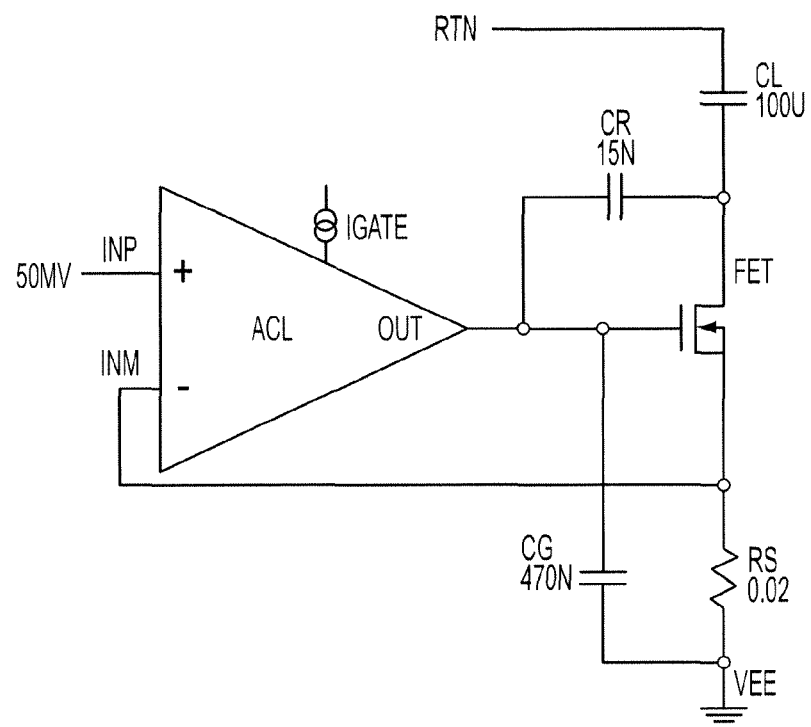
FIG. 1 is a partial schematic and partial block diagram of a first prior art inrush current control system.
Figure 2:
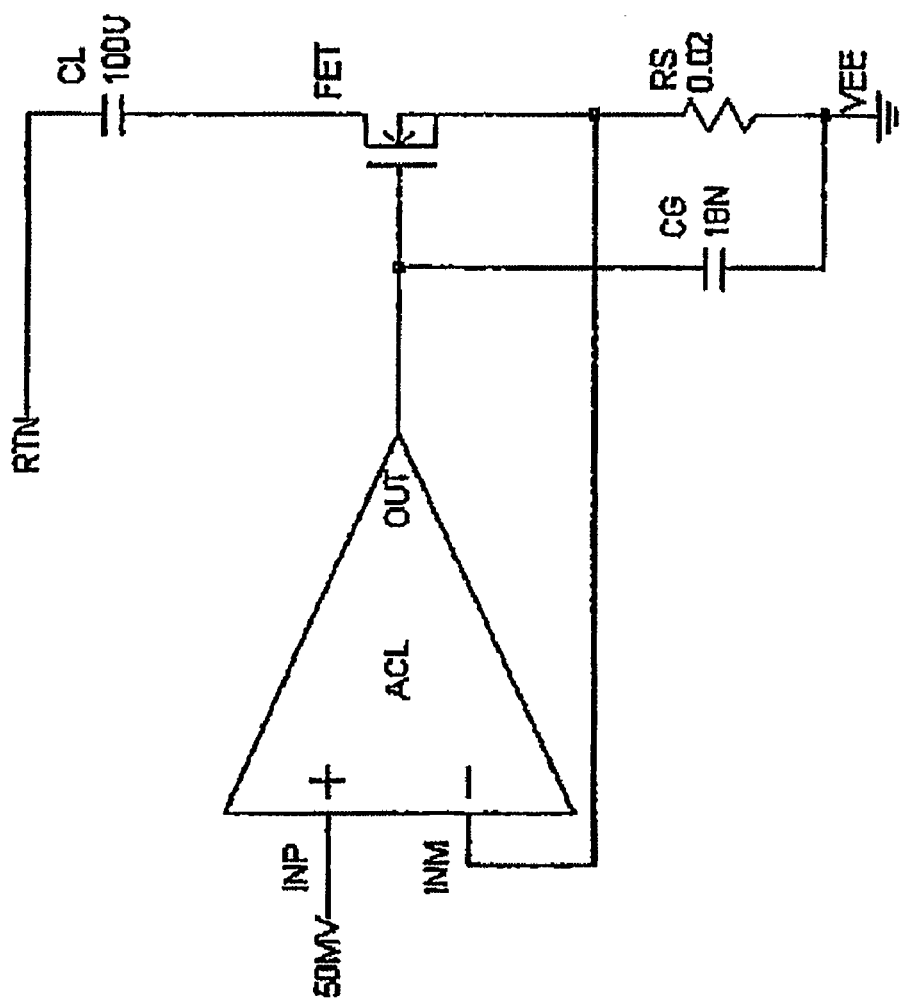
FIG. 2 is a partial schematic and partial block diagram of a second prior art inrush current control system.
Figure 3:
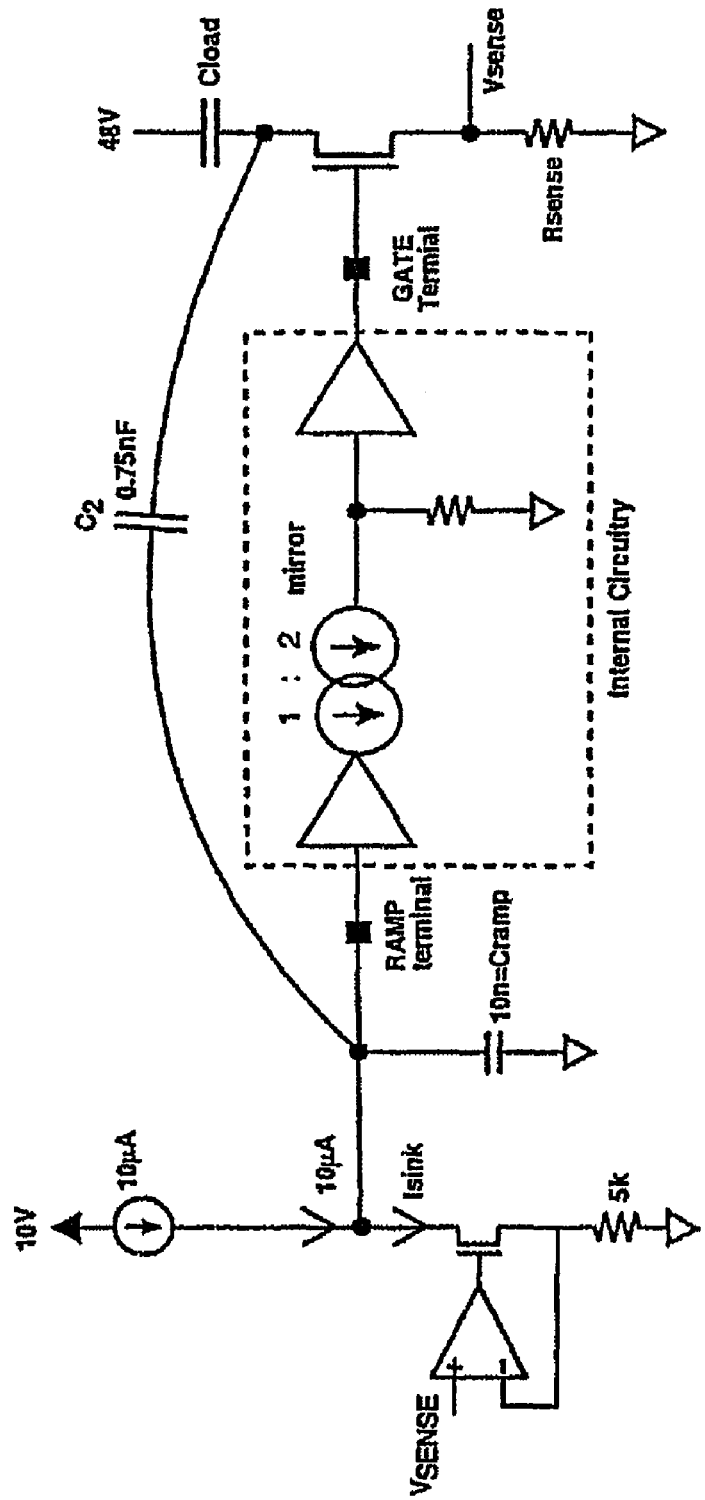
FIG. 3 is a partial schematic and partial block diagram of a third prior art inrush current control system.
Figure 4:
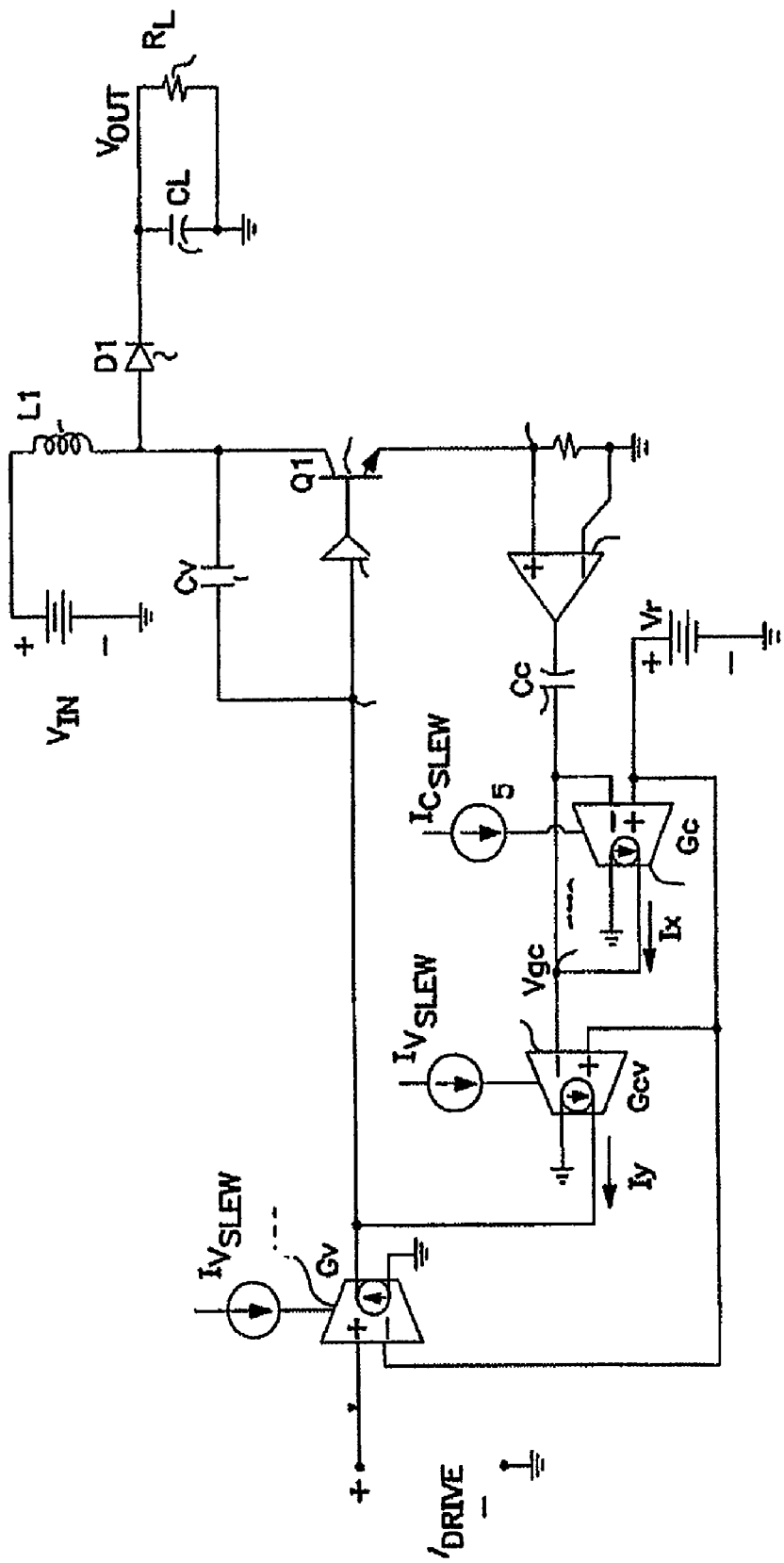
FIG. 4 is a partial schematic and partial block diagram of a switching regulator that slows down both the voltage and current slew rates to avoid excessive current overloads.

It should be noted that the capacitor ($C_R$) of the FIG. 1 embodiment of the prior art has been moved in the embodiment shown in FIG. 5 so as to be connected between the drain of the FET (capacitor 110 ($C_R$)) and the (RAMP) terminal 56. This reduces and may eliminate the need for a discrete component in the form of a capacitor between the gate of the MOSFET 100 and $V_{EE}$ (it should be noted that some parasitic capacitance will still be present at the gate, but elimination of the discrete component greatly improves the performance of the circuit). For example, a typical capacitance value of the capacitor $C_G$ for the FIG. 1 controller is 470 nanofarads. Where a capacitor $C_G$ is used in the FIG. 5 embodiment, it can have a typical value of 50 nanofarads, thus allowing for a significant reduction in capacitance value of almost 10:1. The capacitance 102 ($C_G$) is vital to the FIG. 1 controller during live insertion for all of the FETs. However, by moving the capacitor $C_R$, the value of capacitor 102 ($C_G$) can be greatly reduced, and in some cases, depending on the threshold level of the MOSFET used, can even be eliminated. The resistor 112 is optional depending upon system requirements. The result is that the MOSFET 100 can turn on and off much faster. In addition, the large value of $C_G$ in the FIG. 1 controller complicates loop compensation. However, with the arrangement described in connection with FIG. 5, the capacitor 110 ($C_R$) can be replaced by a resistive element. Thus, benefits of the FIG. 5 embodiment include (a) significantly reducing the value of or eliminating the need for capacitor $C_G$ by rerouting capacitor $C_R$ so that it is connected between the RAMP terminal and the DRAIN of the FET 100, (b) allowing the MOSFET 100 to respond much faster since the ACL 66 does not need to drive a large capacitor $C_G$, and (c) simplifying and making more stable the compensation loop of the circuit.

Further, the component(s) connected between the RAMP terminal 56 and the DRAIN of the MOSFET 100 (shown as a capacitor $C_R$ 110 and resistor 112, although in some instances only one of those components are necessary) are used to generate a ramp signal (current) from the DRAIN of the MOSFET 100 (or output voltage) so as to limit the inrush current flowing through the MOSFET 100.

Thus, the method of and system for controlling the dI/dt of an inrush output current of a inrush current control system provided in accordance with the present disclosure have been described. The exemplary embodiment described in this specification have been presented by way of illustration rather than limitation, and various modifications, combinations and substitutions may be effected by those skilled in the art without departure either in spirit or scope from this disclosure in its broader aspects and as set forth in the appended claims.

The system and method of the present disclosure as disclosed herein, and all elements thereof, are contained within the scope of at least one of the following claims. No elements of the presently disclosed system and method are meant to be disclaimed, nor are they intended to necessarily restrict the interpretation of the claims.

What is claimed is:

1. A method of controlling inrush current generated in a MOSFET of an inrush current control system, the MOSFET having a source, gate, and drain, the method comprising the steps of:
   limiting MOSFET gate turn-on current to a prescribed value;
   subtracting from the value of the limited MOSFET gate turn-on current a limited value of MOSFET gate turn-off current, to regulate dV/dt at the MOSFET drain so as to control the inrush current; and
   limiting an absolute value of current through the MOSFET by subtracting an unlimited value of MOSFET gate turn-off current from the value of the MOSFET gate turn-on current.

2. The method of claim 1, wherein the dV/dt at the MOSFET drain is sensed using a capacitor that is non-loading with respect to the MOSFET gate.

3. The method according of claim 2, wherein the capacitor is coupled to an impedance that does not vary with an output voltage of the inrush current control system.

4. The method of claim 2, further comprising the step of filtering a signal at a terminal of the capacitor.

5. The method of claim 1, wherein the inrush current control system includes only a single transistor stage between the MOSFET drain and the MOSFET gate.

6. The method of claim 1, wherein the inrush current control system includes a current input, a gate pin output and a ramp pin output, the ramp pin output being coupled to the drain of the MOSFET, and the gate pin output coupled to the gate of the MOSFET.

wherein the method further comprises:
   forcing current out of the ramp pin when the MOSFET is turned on.

7. The method of claim 1, wherein the inrush current control system includes a component coupled to the drain of the MOSFET, and
   the step of controlling the inrush current includes:
   generating a ramp current through the component so as to generate a ramp voltage at the drain of the MOSFET and limit the inrush current.

8. The method according to claim 7, wherein the step of generating a ramp current includes generating a ramp current through a capacitive element coupled to the drain of the MOSFET.

9. The method according of claim 7, wherein the step of generating a ramp current includes generating a ramp current through a resistive element coupled to the drain of the MOSFET.

10. The method of claim 1 further comprising:
    limiting the current through the MOSFET during an over current condition.

11. The method of claim 1 further comprising:
    limiting the current through the MOSFET during an output short event.

12. The method of claim 1, wherein the inrush current control system includes a current input, and a ramp pin output, the ramp pin output being coupled to the drain of the MOSFET,
    the method further comprising:
    holding the voltage at the ramp pin during power up or power step conditions.

13. The method of claim 1, wherein dV/dt at the MOSFET drain is regulated so as to control the rate of rise of the inrush current, dI/dt.

14. An inrush current control circuit for controlling inrush current generated in a MOSFET having a source, gate, and drain, the inrush control circuit being configured for:
    limiting MOSFET gate turn-on current to a prescribed value;
    subtracting from the value of the limited MOSFET gate turn-on current a limited value of MOSFET gate turn-off current, to regulate dV/dt at the MOSFET drain so as to control the inrush current; and
    limiting an absolute value of current through the MOSFET by subtracting an unlimited value of MOSFET gate turn-off current from the value of the MOSFET gate turn-on current.

* * * * *